(12) United States Patent
Ra

(10) Patent No.: US 6,447,635 B1
(45) Date of Patent: Sep. 10, 2002

(54) PLASMA PROCESSING SYSTEM AND SYSTEM USING WIDE AREA PLANAR ANTENNA

(75) Inventor: Yunju Ra, Placentia, CA (US)

(73) Assignee: Bethel Material Research, Placentia, CA (US)

(*) Notice: Subject to any disclaimer, the term of this patent is extended or adjusted under 35 U.S.C. 154(b) by 0 days.

(21) Appl. No.: 09/379,663

(22) Filed: Aug. 24, 1999

(51) Int. Cl.[7] ................................ C23F 1/02; C23C 16/00
(52) U.S. Cl. ........................... 156/345.48; 118/723 AN; 315/111.51
(58) Field of Search ................. 118/723 I, 723 IR, 118/723 AN; 156/345; 315/111.51; 343/741, 745, 742, 743, 866, 867, 870

(56) References Cited

U.S. PATENT DOCUMENTS

| | | | | |
|---|---|---|---|---|
| 5,558,722 A | * | 9/1996 | Okumura et al. | 118/723 I |
| 5,690,781 A | * | 11/1997 | Yoshida et al. | 156/345 |
| 5,800,619 A | * | 9/1998 | Holland et al. | 118/723 I |
| 5,951,773 A | * | 9/1999 | Jang et al. | 118/723 R |
| 6,030,667 A | * | 2/2000 | Nakagawa et al. | 427/569 |
| 6,164,241 A | * | 12/2000 | Chen et al. | 118/723 I |

\* cited by examiner

*Primary Examiner*—Gregory Mills
*Assistant Examiner*—Luz Alejandro
(74) *Attorney, Agent, or Firm*—William J. Benman

(57) ABSTRACT

An antenna adapted to apply a uniform electromagnetic field to a volume of gas and including an input terminal for receiving electrical energy into the antenna and an array of radiating elements connected to the input terminal thereof. In the illustrative embodiment, the antenna has four radiating elements. Each radiating element is a conductor wound in a rectangular spiral shape. Each radiating element is connected to the input terminal on one end and an output terminal on a second end thereof. The input terminal is equidistant from first, second, third and fourth output terminals connected to the first, second, third and fourth radiating elements, respectively. The inventive antenna affords a novel method for plasma processing a device including the steps of: mounting the device within a chamber; providing a gas the chamber; and applying an electromagnetic field to the gas via an array of antenna elements disposed relative to the gas to generate a uniform distribution of the plasma.

14 Claims, 3 Drawing Sheets

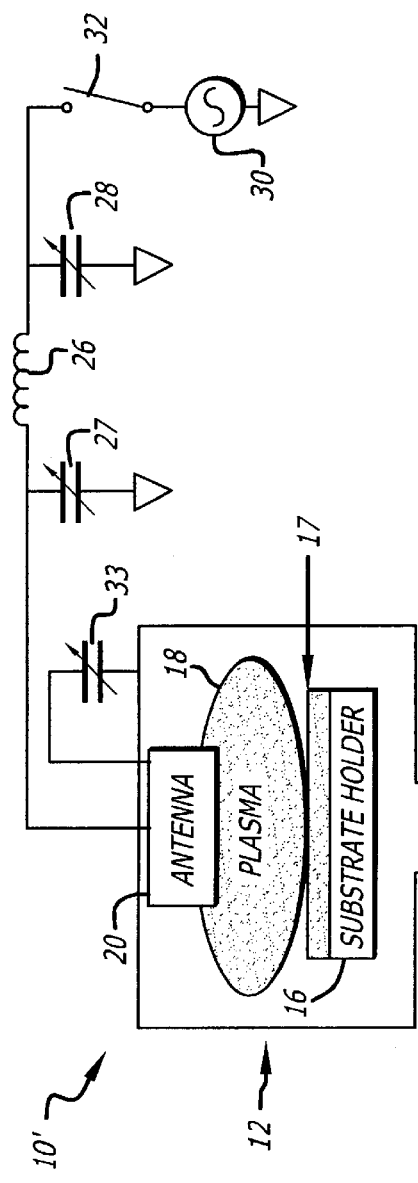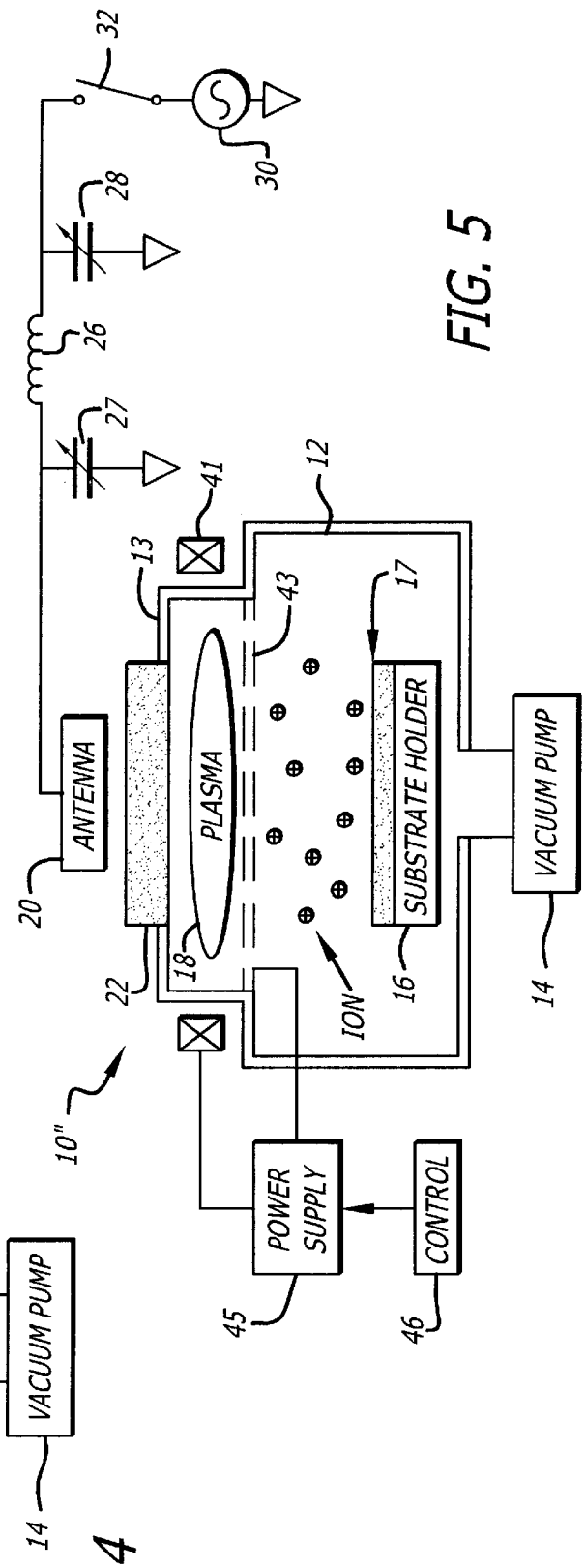
FIG. 4
FIG. 5

PLASMA PROCESSING SYSTEM AND SYSTEM USING WIDE AREA PLANAR ANTENNA

BACKGROUND OF THE INVENTION

1. Field of the Invention

The present invention relates to plasma etching systems. More specifically, the present invention relates to plasma sources used for plasma etching, chemical vapor deposition, photo-resist stripping and other applications relating to semiconductor, flat panel display, printed circuit board and other fabrication processes.

2. Description of the Related Art

Plasma and ion beam sources capable of generating uniform plasma over a wide area are needed for plasma etching, plasma enhanced chemical vapor deposition (CVD), physical vapor deposition, photoresist stripping and surface treatments for many applications. Illustrative applications include silicon and compound semiconductor fabrication, flat panel display fabrication including active matrix liquid crystal display, plasma display panels, field emission displays etc. Additional applications include hard disk drive head and media manufacturing, micro-electromechanical system manufacturing and printed wiring board fabrication.

A plasma source typically includes a radio frequency antenna, a dielectric window and a volume of gas. An electric field from an impedance matched power supply is applied to the gas by the antenna through the dielectric window. The application of the electric field to the gas generates two fields of interest with respect to plasma etching processes: a time varying electromagnetic field and a capacitive electrostatic field. The electromagnetic field strips free electrons from the gas in accordance with an inductive coupling gas plasma technique. Ions generated by the application of the electric field to the gas are utilized in accordance with a capacitive gas plasma technique. Free electrons gain energy by electric fields and generate ions by collision with neutral gases. The inductive technique is known to be more efficient in the production of ions than the capacitive coupling technique. A typical plasma etcher uses an additional electric field capacitively coupled to the substrate to increase ion energy.

Inductively coupled plasma sources using planar antennas have been mainly used for etching due to the simplicity of the antenna. High plasma density and electromagnetic wave coupling uniformity are needed for such applications. The conventional planar antenna design is generally coiled and yields narrow plasma, which has a higher power density at the center thereof, in the area where the antenna is fed. Efforts to increase the coverage area have been limited by self-resonance of the antenna. 'Self-resonance' is an electrical characteristic of the antenna due to the inductive and capacitive effects that adversely impact the performance thereof.

Hence, there is a need in the art for a system or technique for generating a high density, uniform gas plasma affording a wide coverage area.

SUMMARY OF THE INVENTION

The need in the art is addressed by the antenna of the present invention. The inventive antenna is adapted to apply a uniform electromagnetic field to a volume of gas and includes an input terminal for receiving electrical energy into the antenna and an array of radiating elements connected to the input terminal.

In the illustrative embodiment, the antenna has four radiating elements. Each radiating element includes a conductor wound in a rectangular spiral shape. Each radiating element is connected to the input terminal on one end and an output terminal on a second end thereof. The input terminal is equidistant from first, second, third and fourth output terminals connected to the first, second, third and fourth radiating elements, respectively.

The inventive antenna is adapted for use in a plasma processing system comprising a vacuum chamber, a gas disposed within the vacuum chamber, a dielectric window disposed on the vacuum chamber, and a power circuit. The power circuit includes a source of radio frequency (RF) power, a switch and an impedance matching circuit. The impedance matching circuit efficiently couples power from the RF supply to the antenna.

The inventive antenna may be inserted into the plasma without using a dielectric window, thereby enhancing power coupling efficiency. In addition, by adjusting the value of a capacitor connected to the output terminals of each radiating element, capacitive electric field components generated by the antenna can be controlled. To prevent erosion of the antenna by the plasma, the antenna may be positioned outside the vacuum chamber to induce an electric field through a dielectric plate.

The inventive antenna affords a novel method for plasma processing a device including the steps of: mounting the device within a chamber; providing a gas the chamber; and applying an electromagnetic field to the gas via an array of antenna elements disposed relative to the gas to generate a uniform distribution of the plasma.

BRIEF DESCRIPTION OF THE DRAWINGS

FIG. 4 is a schematic diagram of an alternative embodiment of a plasma processing system incorporating the wide area planar antenna plasma source of the present invention.

FIG. 5 is a second alternative implementation of a plasma processing system incorporating the teachings of the present invention.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
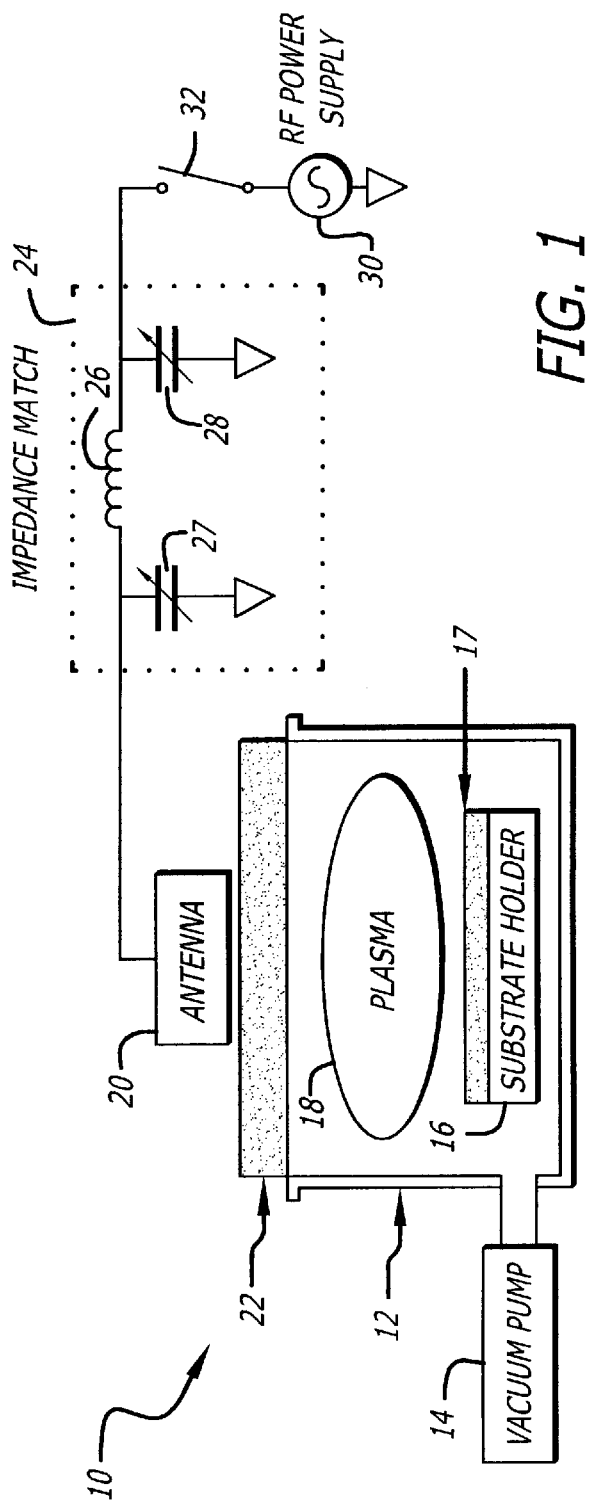
FIG. 1 is a schematic diagram of a plasma processing system incorporating the wide area planar antenna plasma source of the present invention.

FIG. 1 is a schematic diagram of a plasma processing system incorporating the wide area planar antenna plasma source of the present invention. The system 10 includes a vacuum chamber 12, which is evacuated by a vacuum pump 14. A substrate holder 16 is shown within the chamber 12 holding a substrate 17. The antenna 20 of the present invention is mounted at a dielectric window 22 on the chamber 12. A source of radio frequency (RF) power 30 supplies energy to the antenna 20 via a switch 32 and an impedance matching network 24. The impedance matching network 24 is represented by first and second variable capacitors 27 and 28 disposed between ground an inductive element 26. Those skilled in the art will appreciate that the impedance matching network 24 may be implemented with a variety of circuit configurations and components. The impedance matching network efficiently couples RF power to the antenna 20. The antenna 20 induces an electric field through the dielectric window 22. A gas such as argon, oxygen or other suitable gas is provided within the chamber 12 to provide plasma 18 when an electromagnetic field is applied by the antenna 20.

In FIG. 1, the antenna 20 is positioned outside the chamber 12 to prevent erosion of the antenna by the plasma 18. As discussed more fully below, in accordance with an alternative implementation, the antenna is placed within the chamber 12.

Figure 2:
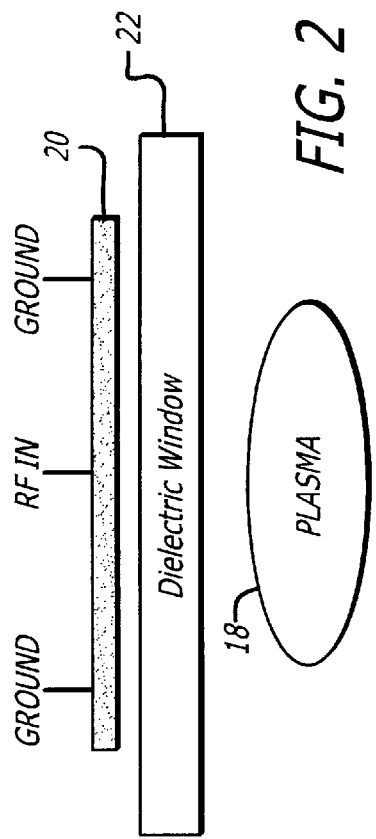
FIG. 2 is a magnified side view of a simplified representation of the antenna of the present invention relative to a dielectric window and plasma.

FIG. 2 is a magnified side view of a simplified representation of the antenna 20, relative to the dielectric window 22 and the plasma 18.

Figure 3A:
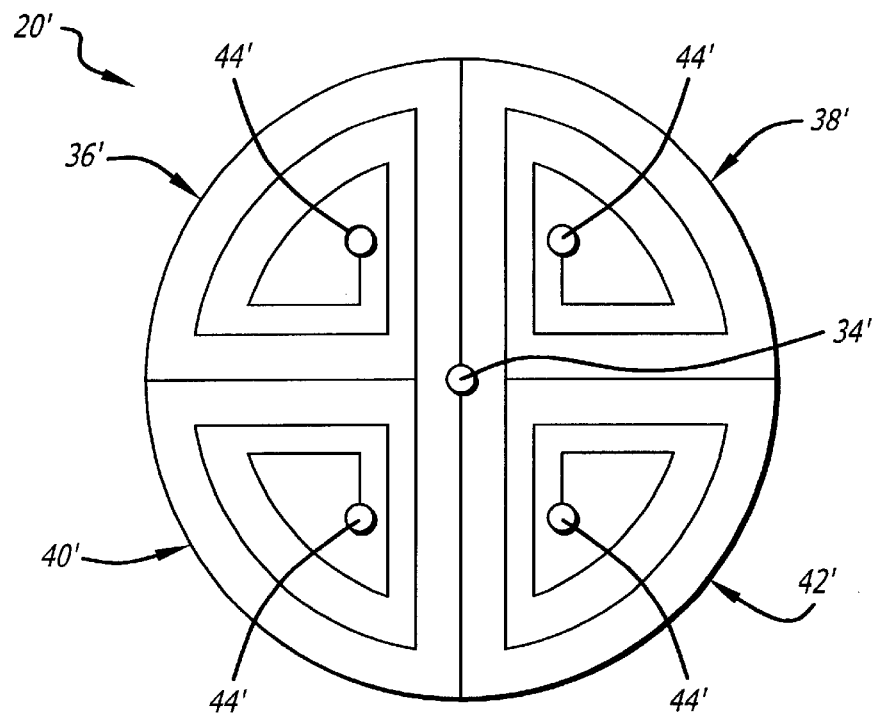
FIG. 3a is a front view of the antenna of the present invention.

FIG. 3a is a front view of the antenna of the present invention. As illustrated in FIG. 3a, the antenna 20' has an input terminal 34' which feeds RF power from the source 30 to first, second, third and fourth radiating elements 36'–42' (even numbers only). Each radiating element is constructed of copper or other suitable conductor. Current is fed first along the periphery of the antenna 20' into each radiating element. Each element has a semi-spherical pie shape with the first and second elements 36' and 38' being mirror images of each other and the third and fourth elements 40' and 42' being mirror images of each other. In combination, the radiating elements create a spherical antenna. Each radiating element terminates in a ground connection via a coupler 44'.

Figure 3B:
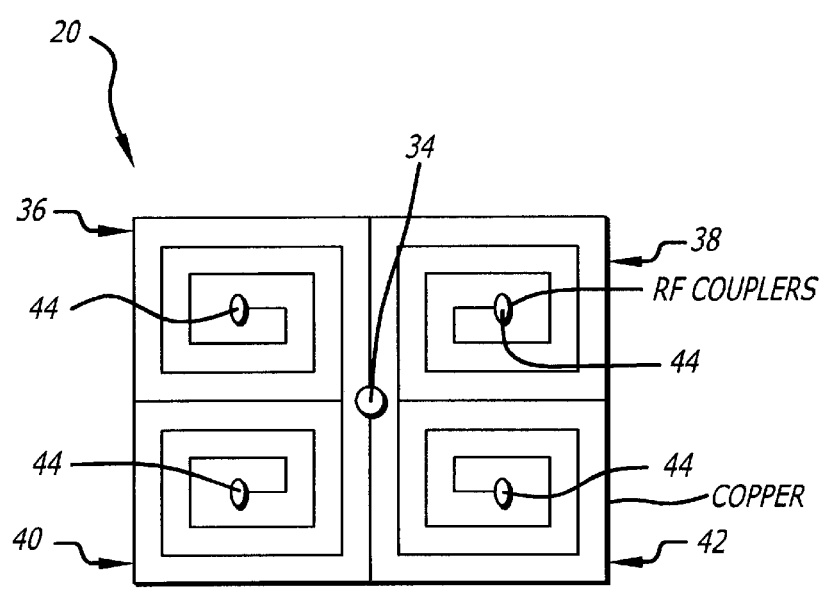
FIG. 3b is a front view of an alternative embodiment of the antenna of the present invention.

FIG. 3b is a front view of an alternative embodiment of the antenna 20 of the present invention. As illustrated in FIG. 3b, the antenna 20 has an input terminal 34 which feeds RF power from the source 30 to first, second, third and fourth radiating elements 36–42 (even numbers only). Each radiating element is constructed of copper or other suitable conductor. Current is fed first along the periphery of the antenna 20 into each radiating element. Each element has a rectangular spiral shape with the first and second elements 36 and 38 being mirror images of each other and the third and fourth elements 40 and 42 being mirror images of each other. Each radiating element terminates in a RF output coupler 44.

In operation, a door (not shown) on the chamber 12 is opened and a substrate 17 is placed on the substrate holder 16 inside the chamber. Next, the chamber 12 is evacuated by the pump 14. At this point, a gas is supplied to the chamber via a gas supply and a pipe or conduit (neither of which are shown). The switch 32 is closed and RF power is supplied to the antenna 20 or 20' via the impedance matching network 24. The application of current to the antenna 20 causes the antenna to launch an electromagnetic field into the chamber. As is well known in the art, a time varying electromagnetic or electrostatic capacitive field may be applied. In the preferred embodiment, a field is applied which stimulates free-electrons within the gas. The excitation of electrons within the gas operates to treat the surface of the substrate 17 as required for plasma etching, plasma enhanced CVD, physical vapor deposition, photoresist stripping and other applications as will be appreciated by those skilled in the art.

Division of input current into four radiating elements affords minimal inductance and self-resonance and improved area of coverage and uniformity in the application of electromagnetic energy to the plasma relative to conventional single spiral designs. In addition, the distribution of the input current into multiple radiating elements allows for the generation of intense electromagnetic field density without inducing a substantial voltage drop between the RF input and the output terminals. Cooling water may be injected and extracted from ground with minimal electrical isolation problems.

FIG. 4 is a schematic diagram of an alternative implementation of a plasma processing system incorporating the wide area planar antenna plasma source of the present invention. The embodiment 10' of FIG. 4 is essentially identical to the embodiment 10 of FIG. 1 with the exception that the antenna 20 is inserted into the chamber 20 into the plasma 18. This allows for the elimination of the dielectric window 22 of FIG. 1. The elimination of the thick ceramic dielectric window 22 enhances power coupling efficiency as the inductive electromagnetic field is not reduced thereby.

In the alternative implementation, the antenna 20 is isolated from ground by an additional capacitor 33 connected to the output terminals of each radiating element. By adjusting the value of the capacitor 33, capacitive electric field components generated by the antenna 20 can be controlled.

FIG. 5 is a second alternative implementation of a plasma processing system incorporating the teachings of the present invention. The implementation 10" of FIG. 5 is identical to that of FIG. 1 with the exception that a winding 41 is provided about an upper section 13 of the chamber 12. The winding 13 is energized by a power supply 45 under control of a controller 46. The power supply 45 also energizes an ion grid 43 disposed between the upper section 13 and the main body of the chamber 12. The grid 43 facilitates the extraction of ions. The implementation of FIG. 5 addresses those applications that require only energetic ions. The inventive plasma source can also be used to generate an ion beam for those applications by extracting only ions from the plasma generated by the plasma source. Grid arrays are used to accelerate ions and to repel electrons from the plasma source by applying electrostatic voltage to the grids. To increase plasma density, magnets can be used at the edge of the plasma source.

Thus, the present invention has been described herein with reference to a particular embodiment for a particular application. Those having ordinary skill in the art and access to the present teachings will recognize additional modifications applications and embodiments within the scope thereof It is therefore intended by the appended claims to cover any and all such applications, modifications and embodiments within the scope of the present invention.

Accordingly,

What is claimed is:

1. An antenna system for applying a uniform electromagnetic field to a volume of gas comprising:
    an input terminal electrically connected to a source for receiving electrical energy into said antenna;
    an output terminal electrically connected via a direct current path to ground; and
    an array of radiating elements, said array including multiple radiating elements and each radiating element including a conductor wound in a spiral, each of said spirals being coiled about a separate center whereby each spiral is nonconcentric relative to said other spirals, each radiating element being connected to said input terminal at a first end thereof and being connected to said output terminal at a second end thereof.

2. The invention of claim 1 wherein said array of radiating elements includes at least two radiating elements.

3. The invention of claim 2 wherein said array of radiating elements includes four radiating elements.

4. The invention of claim 3 wherein said input terminal is equidistant from first, second, third and fourth output terminals connected to said first, second, third and fourth radiating elements.

5. The invention of claim 4 wherein said first radiating element is a mirror image of said second radiating element in shape.

6. The invention of claim 5 wherein said third radiating element is a mirror image of said fourth radiating element in shape.

7. The invention of claim 3 wherein each radiating element is a pie-shaped spiral.

8. The invention of claim 7 wherein each radiating element is connected to said input terminal on one end and said output terminal on a second end thereof.

9. The invention of claim 8 wherein said input terminal is equidistant from first, second, third and fourth output terminals connected to said first, second, third and fourth radiating elements.

10. The invention of claim 9 wherein said first radiating element is a mirror image of said second radiating element in shape.

11. The invention of claim 10 wherein said third radiating element is a mirror image of said fourth radiating element in shape.

12. The invention of claim 1 wherein each radiating element is a rectangular spiral.

13. The invention of claim 12 wherein each radiating element is connected to said input terminal on one end and said output terminal on a second end thereof.

14. The invention of claim 1 wherein each radiating element is a spiral having multiple turns.

* * * * *